(12) United States Patent
Assefa et al.

(10) Patent No.: US 8,796,747 B2
(45) Date of Patent: Aug. 5, 2014

(54) PHOTONICS DEVICE AND CMOS DEVICE HAVING A COMMON GATE

(71) Applicant: International Business Machines Corporation, Armonk, NY (US)

(72) Inventors: Solomon Assefa, Ossining, NY (US);
William M. J. Green, Astoria, NY (US);
Steven M. Shank, Jericho, VT (US);
Yurii A. Vlasov, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 13/736,672

(22) Filed: Jan. 8, 2013

(65) Prior Publication Data

US 2014/0191302 A1     Jul. 10, 2014

(51) Int. Cl.
*H01L 21/762* (2006.01)

(52) U.S. Cl.
USPC ........... 257/290; 438/230; 438/424; 438/154; 438/688; 438/199

(58) Field of Classification Search
USPC ................. 257/290, E21.7, 348, 347, 431
See application file for complete search history.

(56) References Cited

U.S. PATENT DOCUMENTS

| | | | |
|---|---|---|---|
| 6,429,499 B1 | 8/2002 | Heineke et al. | |
| 6,709,912 B1 * | 3/2004 | Ang et al. | 438/199 |
| 7,083,998 B2 | 8/2006 | Chu et al. | |
| 7,973,377 B2 | 7/2011 | King et al. | |
| 2005/0064621 A1 * | 3/2005 | Lim | 438/57 |
| 2009/0224351 A1 | 9/2009 | Hsieh | |
| 2010/0059822 A1 | 3/2010 | Pinguet et al. | |
| 2012/0129302 A1 * | 5/2012 | Assefa et al. | 438/154 |

OTHER PUBLICATIONS

J. Wang et al., "Enhanced Sensitivity of Small-Size (With 1-um Gate Length) Junction-Field-Effect-Transistor-Based Germanium Photodetector Using Two-Step Germanium Epitaxy by Ultrahigh Vacuum Chemical Vapor Deposition," IEEE Electron Device Letters, vol. 30, Issue10, Oct. 2009, pp. 1066-1068.
A. K. Okyay et al., "Silicon Germanium CMOS Optoelectronic Switching Device: Bringing Light to Latch," IEEE Transactions on Electron Devices, vol. 54, Issue:12, Dec. 2007, pp. 3252-3259.
S. Sahni et al., "Novel CMOS compatible cavity enhanced Ge/SOI photo-detector based on secondary photoconductivity," Conference on Lasers and Electro-Optics, 2006 and 2006 Quantum Electronics and Laser Science Conference. CLEO/QELS 2006. May 21-26, 2006, 2 pages.
G. Masini et al., "A germanium photodetector array for the near infrared monolithically integrated with silicon CMOS readout electronics," Physica E, vol. 16, 2003, pp. 614-619.

* cited by examiner

*Primary Examiner* — Amar Movva
*Assistant Examiner* — Rodolfo Fortich
(74) *Attorney, Agent, or Firm* — Law Offices of Ira D. Blecker, P.C.

(57) ABSTRACT

A semiconductor chip having a photonics device and a CMOS device which includes a photonics device portion and a CMOS device portion on a semiconductor chip; a metal or polysilicon gate on the CMOS device portion, the metal or polysilicon gate having a gate extension that extends toward the photonics device portion; a germanium gate on the photonics device portion such that the germanium gate is coplanar with the metal or polysilicon gate, the germanium gate having a gate extension that extends toward the CMOS device portion, the germanium gate extension and metal or polysilicon gate extension joined together to form a common gate; spacers formed on the germanium gate and the metal or polysilicon gate; and nitride encapsulation formed on the germanium gate. A method is also disclosed pertaining to fabricating the semiconductor chip.

15 Claims, 14 Drawing Sheets

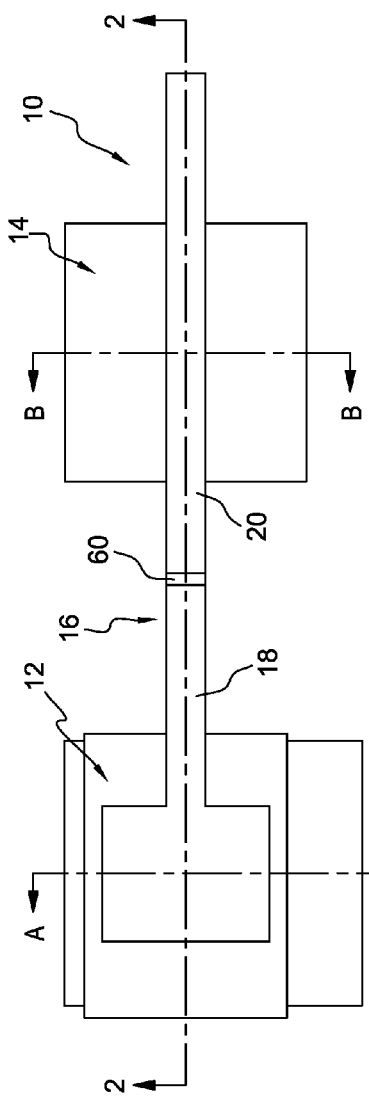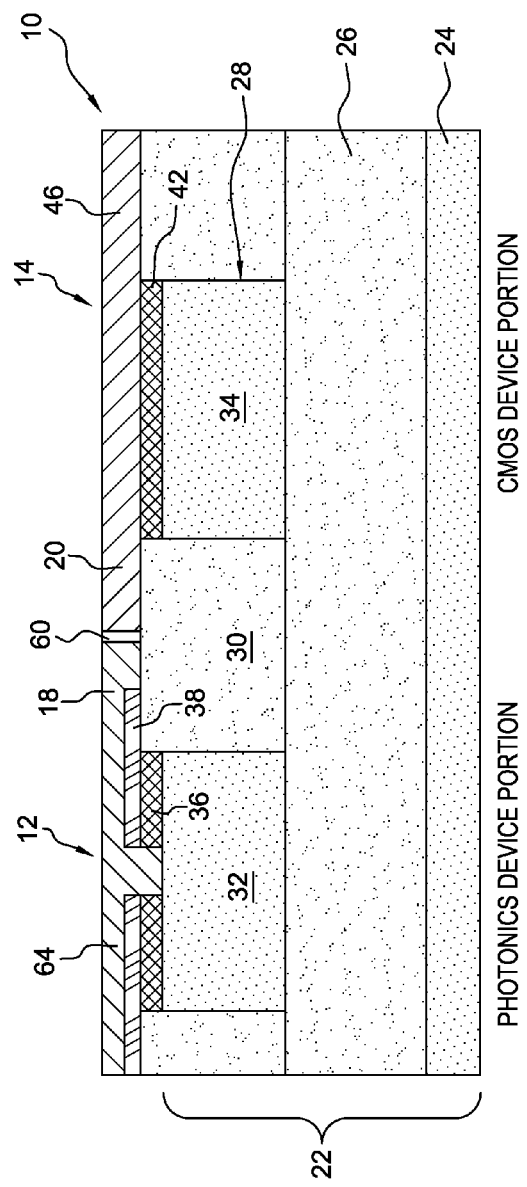

CMOS DEVICE PORTION

PHOTONICS DEVICE PORTION

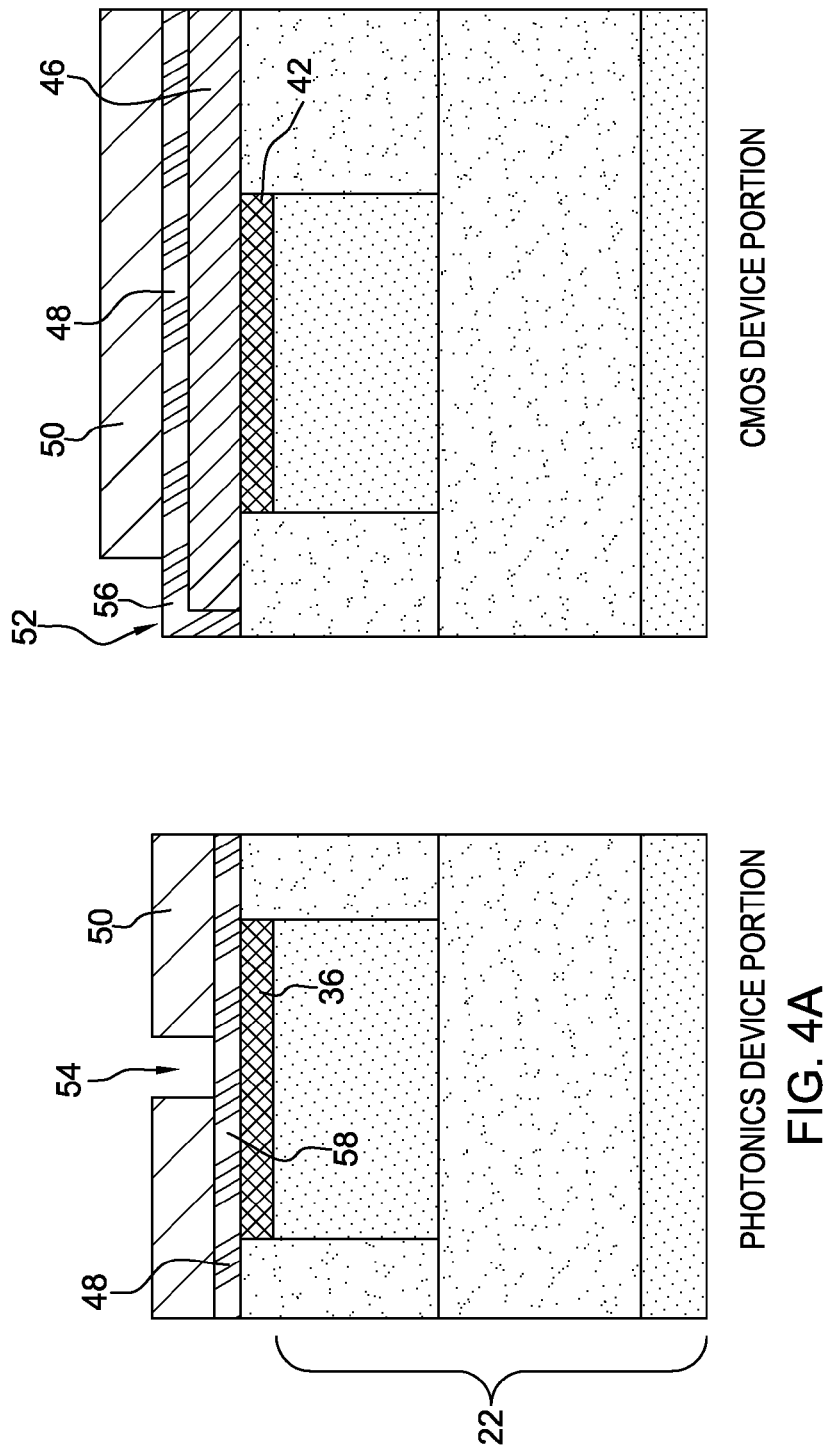

CMOS DEVICE PORTION

PHOTONICS DEVICE PORTION

CMOS DEVICE PORTION

PHOTONICS DEVICE PORTION

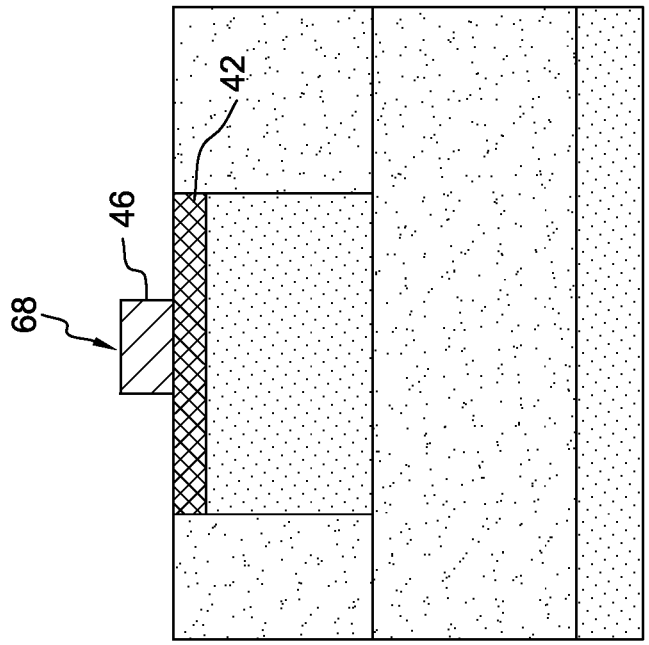
FIG. 8A PHOTONICS DEVICE PORTION
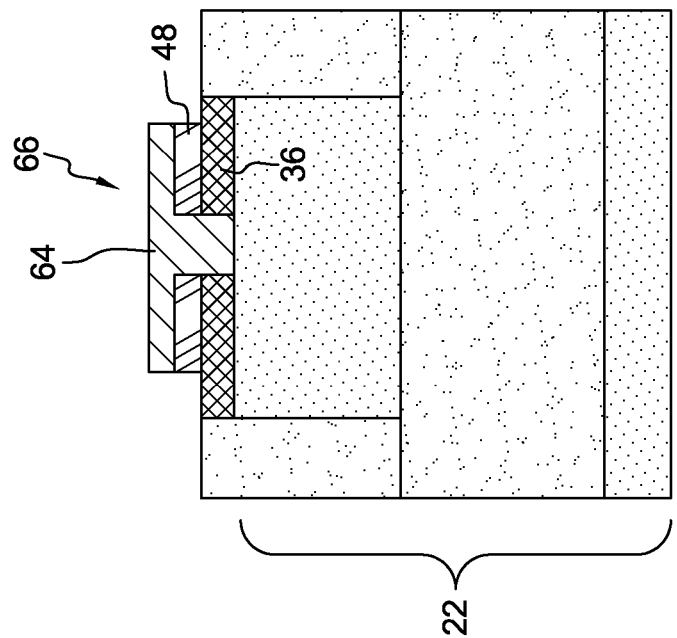
FIG. 8B CMOS DEVICE PORTION

CMOS DEVICE PORTION

PHOTONICS DEVICE PORTION

CMOS DEVICE PORTION

PHOTONICS DEVICE PORTION

CMOS DEVICE PORTION

PHOTONICS DEVICE PORTION

CMOS DEVICE PORTION

PHOTONICS DEVICE PORTION

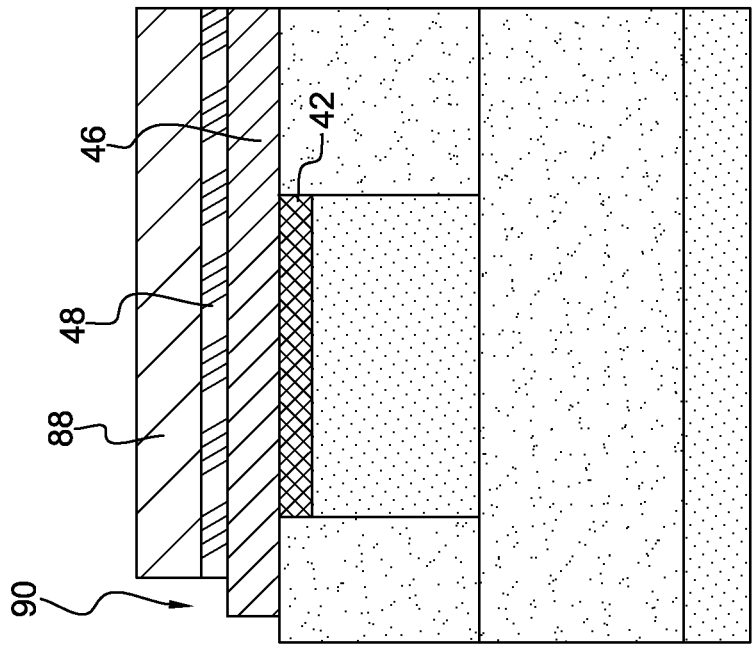
FIG. 13B CMOS DEVICE PORTION
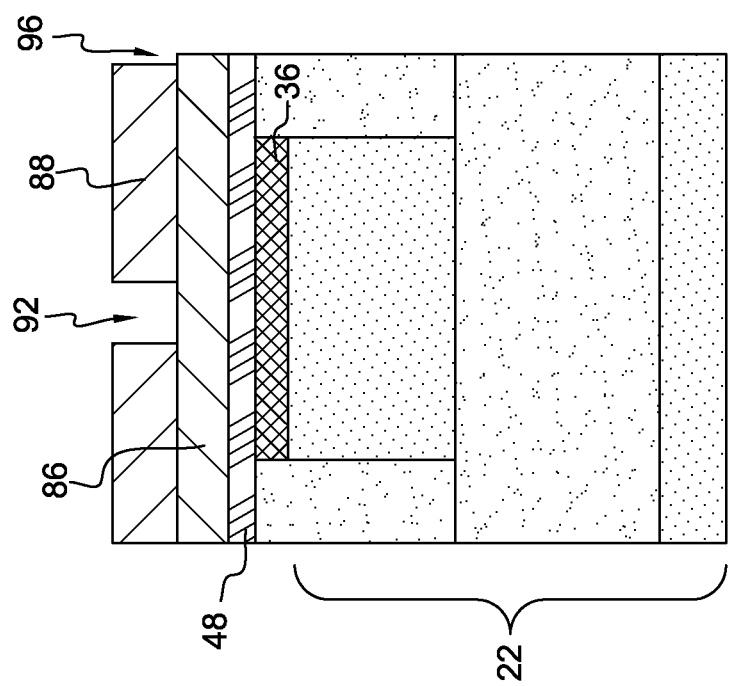
FIG. 13A PHOTONICS DEVICE PORTION

CMOS DEVICE PORTION

PHOTONICS DEVICE PORTION

US 8,796,747 B2

PHOTONICS DEVICE AND CMOS DEVICE HAVING A COMMON GATE

BACKGROUND

The exemplary embodiments relate generally to the processing of integrated circuits and, more particularly, relate to the processing of photonics devices integrated into the processing of integrated circuits.

Optical interconnects can offer significant advantages over electrical circuitry in the field of advanced microelectronics. One possible implementation of an optical interconnect system is based on silicon-on-insulator (SOI) technology, in which optical waveguides are formed on the same thin silicon layer as other complimentary-metal-oxide-semiconductor (CMOS) circuit elements (e.g., field effect transistors (FETs), capacitors, resistors, etc.). Light sources produce optical signals (e.g., light pulses) that propagate in these optical waveguides. Photodetectors convert the optical signals into electrical signals.

The integration of germanium into a conventional CMOS process is complicated by the additional thermal budget required by germanium growth, the maximum temperature germanium can withstand, cross-contamination issues, germanium doping issues, germanium passivation issues, and the tendency of germanium to form non-ohmic contacts when mated with those metallic materials conventionally used for vertical contacts. There is a need, as a result, for structures and process integration schemes that overcome some or all of these issues and allow waveguides and germanium photodetectors to be effectively fabricated in a manner that is compatible with conventional CMOS processing.

BRIEF SUMMARY

The various advantages and purposes of the exemplary embodiments as described above and hereafter are achieved by providing, according to a first aspect of the exemplary embodiments, a method for forming a photonics device and a CMOS device with a common gate. The method including: defining a photonics device portion and a CMOS device portion on a semiconductor chip where a photonics device and a CMOS device, respectively, are to be fabricated; forming a metal or polysilicon gate material on the CMOS device portion; depositing germanium on the photonics device portion and on the metal or polysilicon gate material on the CMOS device portion; planarizing the germanium to form a coplanar layer of germanium and metal or polysilicon gate material; etching the germanium to define a gate on the photonics portion and a gate extension that extends towards the CMOS device portion; etching the metal or polysilicon gate material to define a gate on the CMOS device portion and a gate extension that extends toward the photonics device portion and joins the gate extension from the germanium gate portion wherein the respective joined gate extensions form a common gate between the photonics device portion and CMOS device portion; forming spacers on the germanium gate and metal or polysilicon gate; encapsulating the germanium gate with a nitride; and heating the photonics device portion to cause melting and crystallization of the germanium gate.

According to a second aspect of the exemplary embodiments, there is provided a method for forming a photonics device and a CMOS device with a common gate. The method including: defining a photonics device portion and a CMOS device portion on a semiconductor chip where a photonics device and a CMOS device, respectively, are to be fabricated; forming a metal or polysilicon gate material on the CMOS device portion; depositing germanium on the photonics device portion and on the metal or polysilicon gate material on the CMOS device portion; planarizing the germanium to form a coplanar layer of germanium and metal or polysilicon gate material; etching the germanium to define a gate on the photonics portion; etching the metal or polysilicon gate material to define a gate on the CMOS device portion; forming spacers on the germanium gate and metal or polysilicon gate; encapsulating the germanium gate with a nitride; and heating the photonics device portion to cause melting and crystallization of the germanium gate.

According to a third aspect of the exemplary embodiments, there is provided a semiconductor chip having a photonics device and a CMOS device which includes: a photonics device portion and a CMOS device portion on a semiconductor chip; a metal or polysilicon gate on the CMOS device portion, the metal or polysilicon gate having a gate extension that extends toward the photonics device portion; a germanium gate on the photonics device portion such that the germanium gate is coplanar with the metal or polysilicon gate, the germanium gate having a gate extension that extends toward the CMOS device portion, the germanium gate extension and metal or polysilicon gate extension joined together to form a common gate; spacers formed on the germanium gate and the metal or polysilicon gate; and nitride encapsulation formed on the germanium gate.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIG. 1 is a top view of an intermediate semiconductor structure of a photonics device and a CMOS device.

FIG. 2 is a cross sectional view of the structure in FIG. 1 in the direction of line 2-2 in FIG. 1.

FIGS. 3A to 10A and 3B to 10B illustrate an exemplary method for fabricating the structure in FIG. 1 wherein the "A" Figures are cross-sectional views of the photonics device portion taken in the direction of A-A in FIG. 1 and the "B" Figures are cross-sectional views of the CMOS device portion taken in the direction of B-B in FIG. 1 and wherein:

FIG. 3A shows a nitride layer on the photonics device portion and FIG. 3B shows a metal or polysilicon gate material on the CMOS device portion and a nitride layer on the metal or polysilicon gate material;

FIGS. 4A and 4B show a patterned photoresist layer on the photonics device portion and the CMOS device portion;

FIG. 8A shows the patterning of the germanium gate on the photonics device portion and FIG. 8B shows the patterning of the metal or polysilicon gate on the CMOS device portion;

FIG. 10A shows the encapsulation of the germanium gate on the photonics device portion and FIGS. 10A and 10B show the forming of an interlayer dielectric on the photonics device portion and the CMOS device portion.

FIGS. 11A to 15A and 11B to 15B illustrate an alternative method for preparing the semiconductor structure for deposition of the germanium layer wherein the "A" Figures are cross-sectional views of the photonics device portion taken in the direction of A-A in FIG. 1 and the "B" Figures are cross-sectional views of the CMOS device portion taken in the direction of B-B in FIG. 1 and wherein:

FIG. 11A shows a nitride layer on the photonics device portion and an oxide on the nitride layer and FIG. 11B shows a metal or polysilicon gate material on the CMOS device portion and a nitride layer on the metal or polysilicon gate material;

FIGS. 13A and 13B show the partial etching of the nitride layer on the CMOS device portion through an aperture in the patterned photoresist layer;

FIGS. 15A and 15B show the removal of the photoresist layer.

DETAILED DESCRIPTION

Figure 3B:
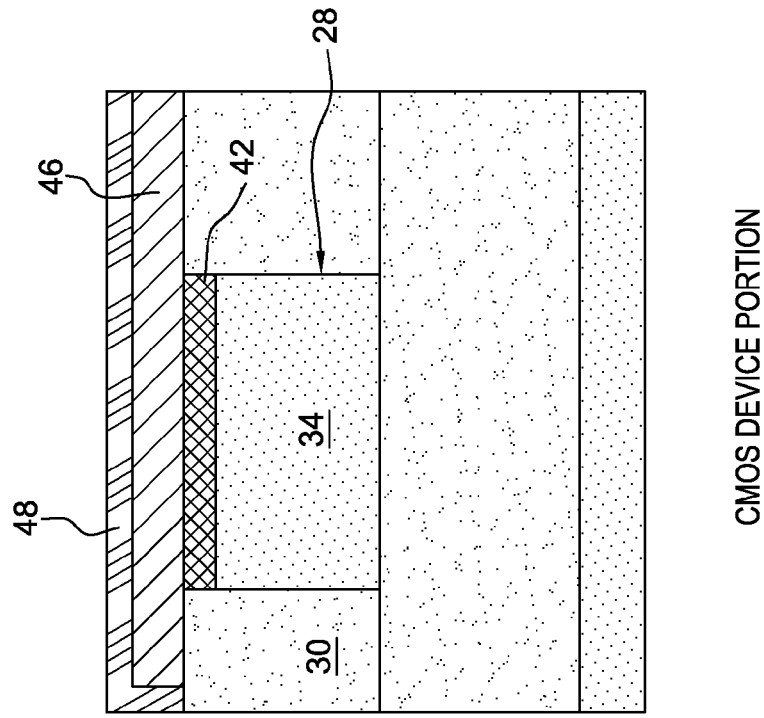

Prior integration methods for combining photonics structures have been directed to forming the photonics device and CMOS device separately, although they are both on the same semiconductor chip. Photonics structures refer to any semiconductor structure that processes, transmits, reflects, diffracts, switches, amplifies or senses light. One example of a photonics structure may be a photodiode for optical interconnects to optically connect the photodiode to another device such as another photodiode or a CMOS device.

The exemplary embodiments are directed to forming a layer of germanium for the photonics device coplanar with the gate material of the CMOS device and then proceeding with gate level patterning. Subsequent processing of the photonics device and CMOS device have many of the same steps.

In another feature of the exemplary embodiments, the photonics device and CMOS device have a common gate structure.

While the exemplary embodiments have particular application to germanium photonics devices, the teaching of the exemplary embodiments may be applied to other materials for photonics applications. Germanium is preferred because processing of germanium is compatible with silicon CMOS processing so that germanium photonics devices and silicon CMOS devices may be processed in the same CMOS fabrication line. Other materials such as group III-V compounds (GaAs, InGaAs, GaP, etc.) may also be used, but due to contamination concerns that the standard CMOS processes may be contaminated by the group III-V compounds, the same CMOS fabrication line may not be used. However, a group III-V fabrication line may potentially be used to manufacture a common gate of CMOS gate polysilicon or metal, with a group III-V gate for a photonics device.

Referring now to the Figures in detail, and particularly referring to FIG. 1, there is shown a top view of an intermediate structure 10 of a photonics device 12 and CMOS device 14. The intermediate structure 10 illustrates that photonics device 12 and CMOS device 14 share a common gate 16 which includes a germanium gate extension 18 and a polysilicon or metal gate extension 20. Spacers and any overlaying layers have been removed to illustrate the common gate 16 of the exemplary embodiments.

A cross-sectional view of intermediate structure 10 in the direction of arrows 2-2 is shown in FIG. 2. Intermediate structure 10 is preferably fabricated on a semiconductor on insulator (SOI) substrate 22 which includes a semiconductor substrate 24, preferably silicon, an insulator layer 26, preferably a buried oxide (BOX) layer, and a semiconductor layer 28, preferably silicon. Semiconductor layer 28 will be referred to hereafter as silicon layer 28.

Silicon layer 28 has been patterned to remove portions of silicon which are replaced with an insulator to form shallow trench isolation (STI) regions 30. The remaining silicon portions 32, 34 form the active areas for the photonics device 12 and CMOS device 14, respectively. Photonics device 12 may have a gate oxide layer 36 and a nitride layer 38 underneath a germanium gate 64. The germanium gate 40 may make direct contact with the silicon portion 32. CMOS device 14 may have a gate oxide layer 42 underneath a polysilicon or metal gate 46.

The processing to form the photonics device 12 and CMOS device 14 now will be described in detail. In the following description, the photonics device process is shown in cross section in the direction of arrows A-A in FIG. 1 and the CMOS device process is shown in cross section in the direction of arrows B-B in FIG. 1. Thus, all Figures with an "A" will be referring to the portion of the semiconductor wafer where fabrication of the photonics device 12 will occur and all Figures with a "B" will be referring to the portion of the semiconductor wafer where fabrication of the CMOS device 14 will occur.

Figure 3A:
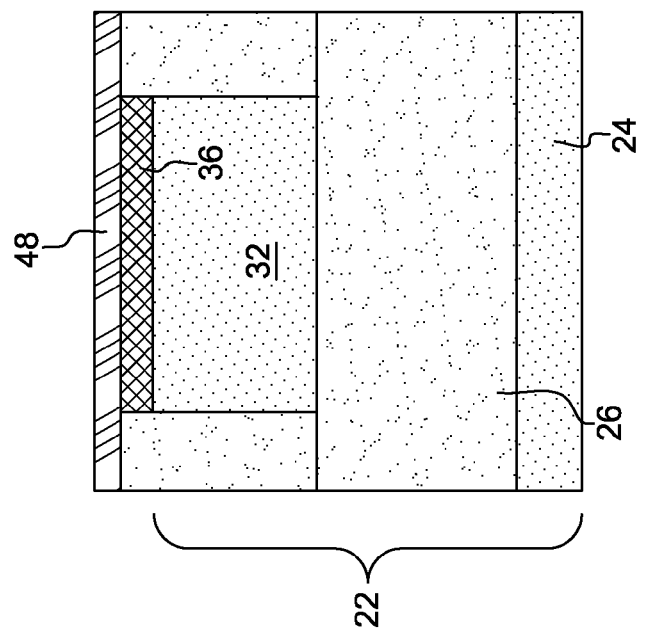

Referring now to FIGS. 3A to 10A and 3B to 10B, there is described a first exemplary method for an integration method of fabricating photonics device 12 and CMOS device 14. FIGS. 3A and 3B begin with the SOI substrate 22 having already been fabricated to have silicon portions 32, 34, STI regions 30 and gate oxides 36, 42. Wells (not shown) for the photonics device portion and CMOS device portion may have already been implanted. A polysilicon or metal gate material (hereafter just "gate material") may be conventionally deposited to a thickness of about 1000 to 2000 angstroms, patterned and etched to form gate material 46. Thereafter, a nitride layer 48 may be deposited over the photonics device portion and CMOS device portion to a thickness of 100 to 1000 angstroms, preferably 500 angstroms.

Referring now to FIGS. 4A and 4B, a conventional photoresist 50 may be deposited over the photonics device portion and CMOS device portion and then patterned to form apertures 52, 54. Thereafter, the photonics device portion and CMOS device portion may be etched, for example by a conventional reactive ion etching (RIE) process to remove nitride portion 56 exposed by aperture 52 and remove nitride portion 58 over gate dielectric 36 exposed by aperture 54.

Figure 5B:
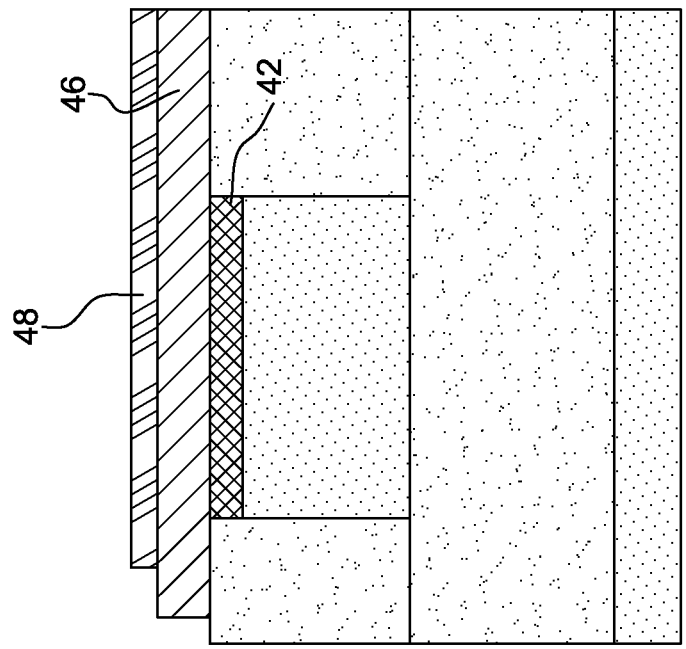
FIGS. 5A and 5B show the partial etching of the nitride layer through apertures in the patterned photoresist layer.
Figure 5A:
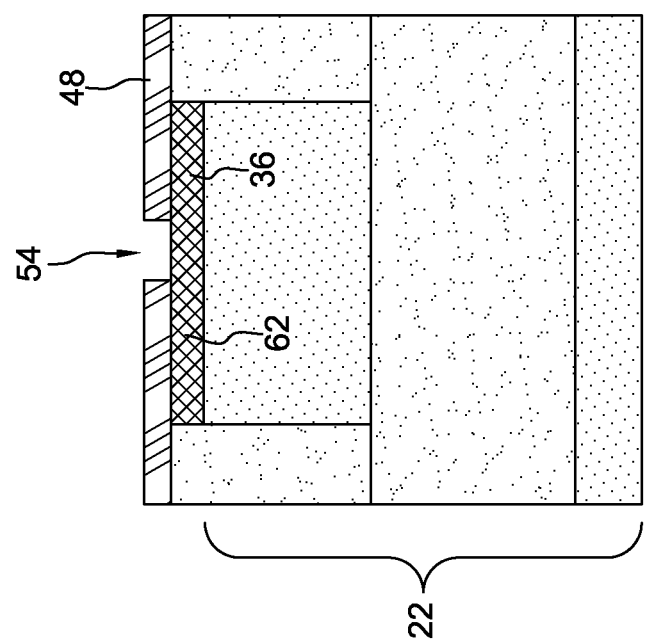

After stripping off the resist 50 by a conventional process, the resulting structure is shown in FIGS. 5A and 5B. At this point it may be desirable to form through deposition, oxidation, or nitridation about 10 angstroms of an oxynitride by a conventional process to the gate material 46 before depositing the germanium in a subsequent step to improve the interface between the germanium and gate material 46 where they meet in the common gate 16 (FIGS. 1 and 2). The photonics portion may be masked off to avoid depositing any oxynitride material on the photonics portion. Oxynitride 60 is shown on the gate material 46 of the CMOS portion in FIGS. 1 and 2.

After the optional formation of the oxynitride 60, the photonics device portion and CMOS device portion may be dipped in dilute hydrofluoric acid to remove the gate oxide 62 exposed by aperture 54. The oxynitride 60 on the gate material 46 may be masked to prevent removal during the dilute hydrofluoric processing.

Figure 6B:
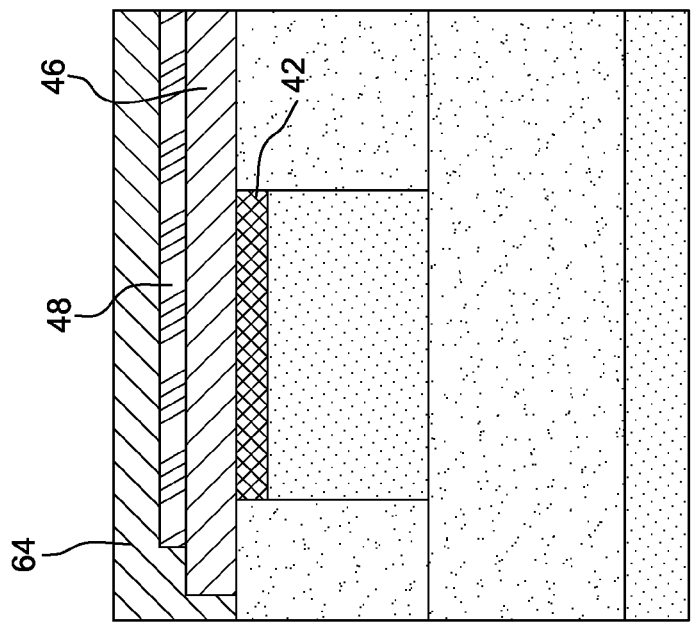
FIGS. 6A and 6B show a layer of germanium on the photonics device portion and the CMOS device portion.
Figure 6A:
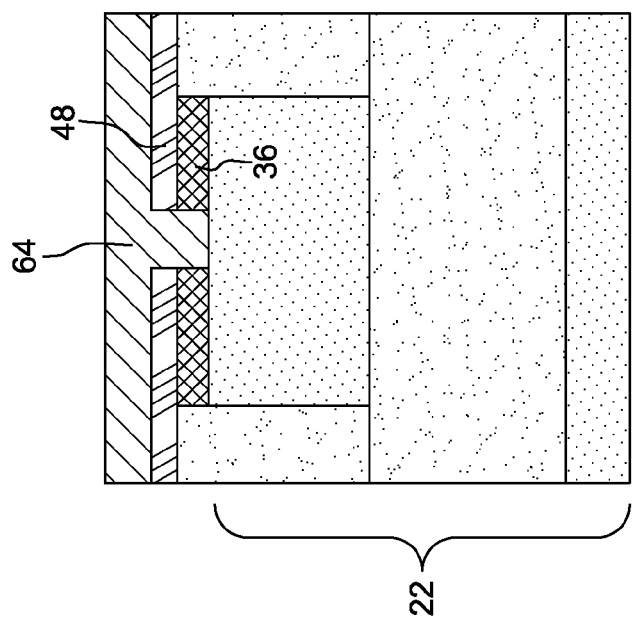

A layer of germanium 64 may then be deposited over the photonics device portion and the CMOS device portion as shown in FIGS. 6A and 6B. The germanium 64 may be deposited, for example, by physical vapor deposition or plasma enhanced chemical vapor deposition, to a thickness of about 100 to 2000 angstroms, preferably about 1500 angstroms. The germanium is preferably deposited as amorphous germanium and then crystallized later. Although not as favored, the germanium may also be deposited epitaxially.

Figure 7B:
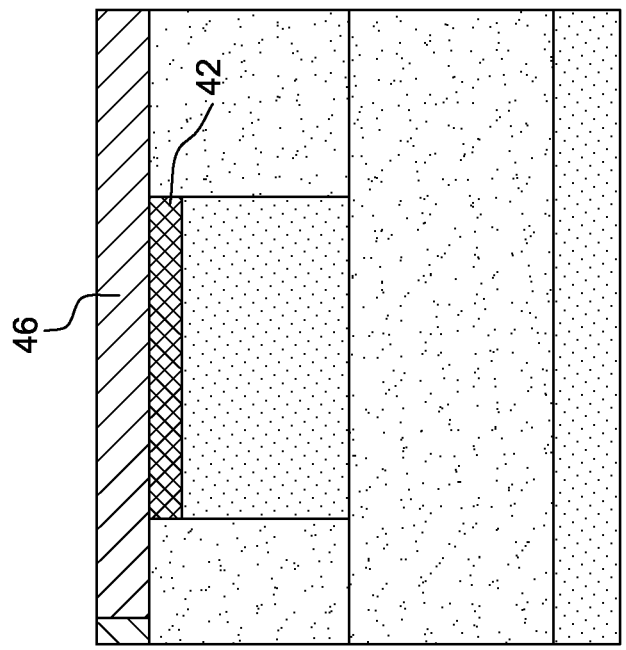
FIGS. 7A and 7B show the planarizing of the germanium layer on the photonics device portion so as to be coplanar with the metal or polysilicon gate material on the CMOS device portion.
Figure 7A:
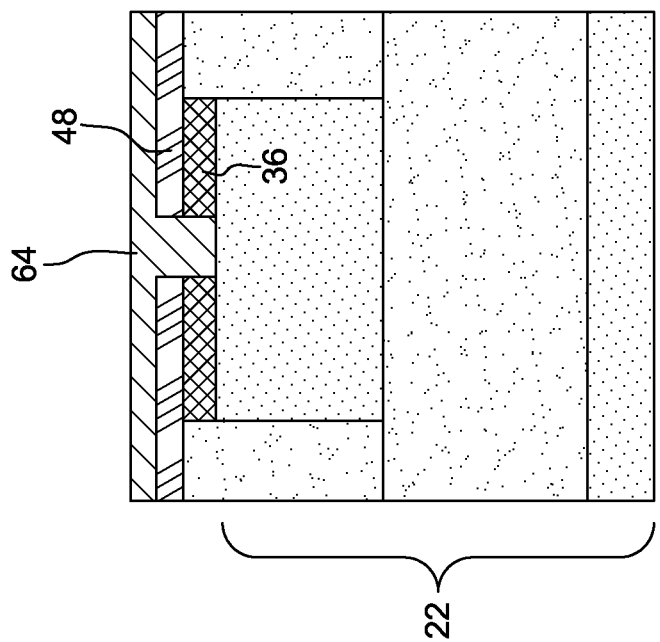

The germanium 64 on the photonics device portion and the CMOS device portion may be conventionally planarized and then the nitride layer 48 etched, for example, by reactive ion etching, to remove it so that the germanium 64 is approximately at the same height as the gate material 46. There may be a small amount of germanium etching while the nitride layer 48 is etched. Alternatively, the germanium may be masked during the etching of the nitride layer 48. The resulting structure is shown in FIGS. 7A and 7B. In a further alternative, the nitride layer 48 on the gate material 46 may be used as a hardmask for the formation of the CMOS gate in a later step as described with respect to FIGS. 8A and 8B, thus eliminating the requirement to remove the nitride layer 48 immediately following the germanium planarization. The nitride hardmask, however, would have to be removed prior to silicide formation.

Referring now to FIGS. 8A and 8B, the germanium 64 and nitride layer 48 are patterned and etched, for example, by reactive ion etching, to form a gate 66 on the photonics device portion. Likewise, the gate material 46 may be patterned and etched, for example, by reactive ion etching, to form a gate 68 on the CMOS device portion. In addition, the common gate 16 (shown in FIG. 1) which includes a germanium gate extension 18 and a polysilicon or metal gate extension 20 may be patterned and etched, for example, by reactive ion etching. The photonics gate 66, CMOS gate 68 and common gate 16 all may be etched and patterned together or separately. However, etching separately may provide better control of the etched profile i.e. sidewalls profile and smoothness, and overetch into the underlying material. A top view of FIGS. 8A and 8B would show the intermediate structure 10 shown in FIG. 1.

Figure 9B:
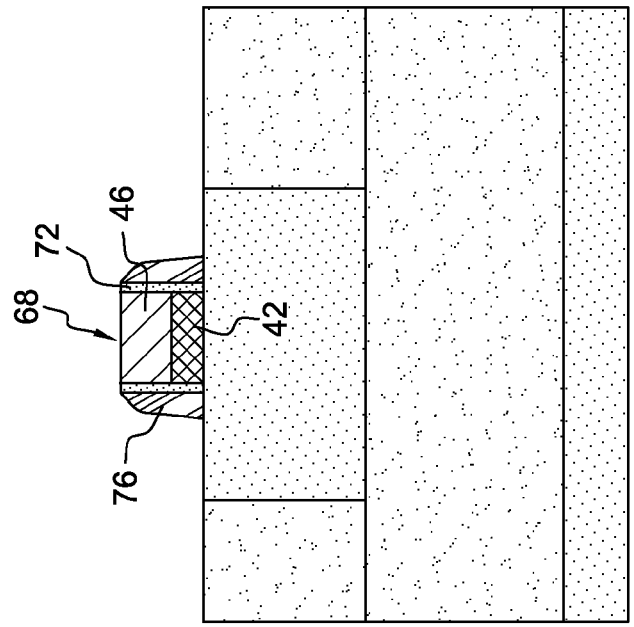
FIG. 9A shows the forming of spacers on the germanium gate on the photonics device portion and FIG. 9B shows the forming of spacers on the metal or polysilicon gate on the CMOS device portion.
Figure 9A:
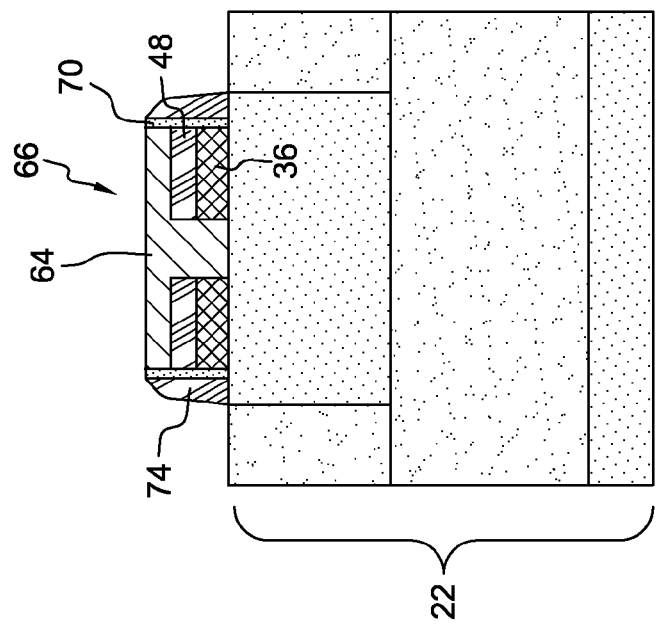

Referring now to FIGS. 9A and 9B, additional conventional processing steps may take place to form a first spacer 70 on gate 66 on the photonics device portion and first spacer 72 on gate 68 on the CMOS device portion. Thereafter, halo and extension implants (not shown) may be done. Then, a second spacer 74 on gate 66 on the photonics device portion and second spacer 76 on gate 68 on the CMOS device portion may be done. Thereafter, source and drain implants (not shown) may be done.

Figure 10B:
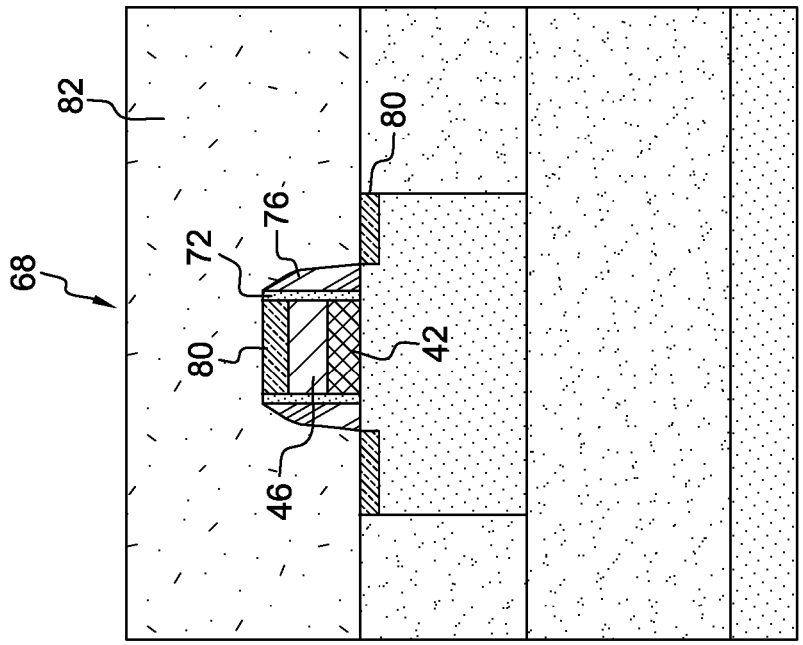
Figure 10A:
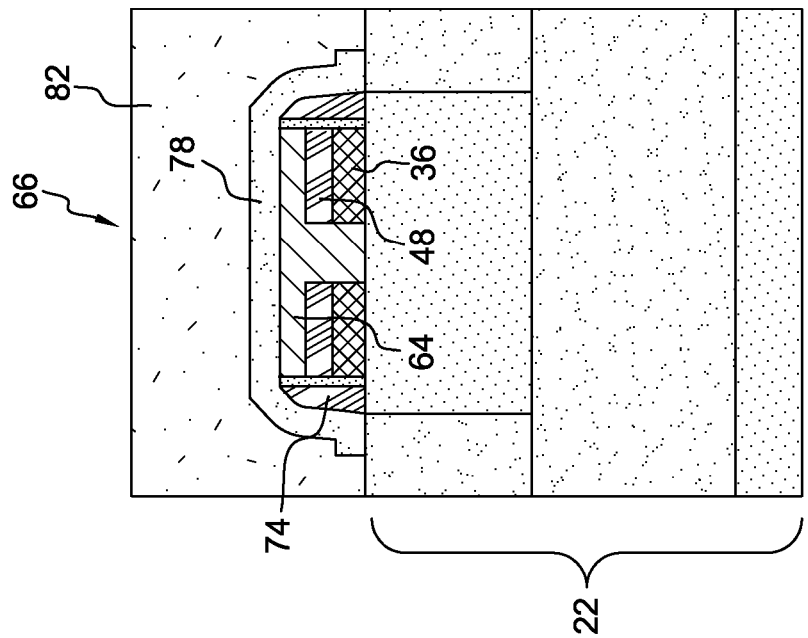

Finally, as shown in FIGS. 10A and 10B, plasma enhanced chemical vapor deposited nitride 78 may be deposited to encapsulate the gate 66 on the photonics device portion. The deposited nitride 78 may alternatively be replaced with a multi-layer oxide and nitride dielectric stack. There may be a source/drain anneal which also melts the germanium 64, followed by crystallization of the germanium 64. The gate 68 may be patterned and etched to remove the plasma enhanced chemical vapor deposited nitride 78 from gate 68 on the CMOS device portion. Thereafter, silicide 80 may be conventionally formed on the CMOS device portion. Processing may then continue by depositing interlayer dielectric 82. Further conventional processing steps such as forming contacts to gates 66 and 68 may take place but are not shown for clarity.

A second exemplary embodiment is disclosed in FIGS. 11A to 15A and 11B to 15B in which a sacrificial oxide layer is utilized to improve the germanium/gate material interface.

Figure 11B:
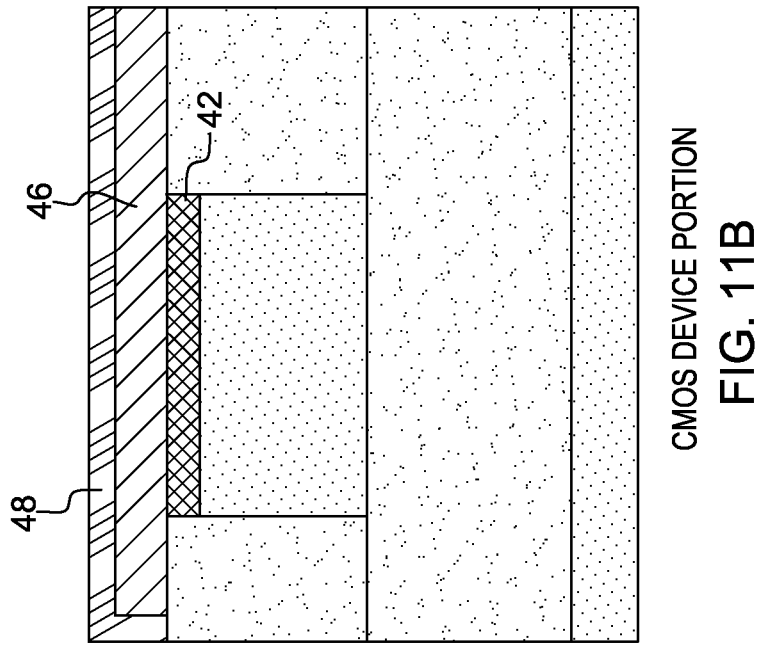
Figure 11A:
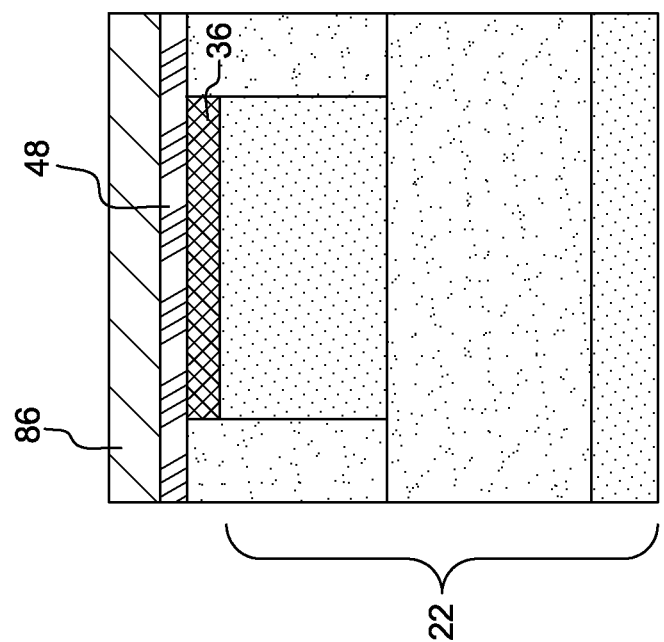

The second exemplary embodiment begins as shown in FIGS. 11A and 11B similarly to the first exemplary embodiment. That is, the CMOS device portion contains the defined gate material 46 and overlying nitride layer 48 as previously described with respect to FIG. 3B. The photonics device portion also contains the nitride layer 48 as previously described with respect to FIG. 3A. However, the photonics device portion now additionally has an oxide layer 86 which was conventionally deposited and planarized to be level with the nitride layer 48 on the CMOS device portion.

Figure 12B:
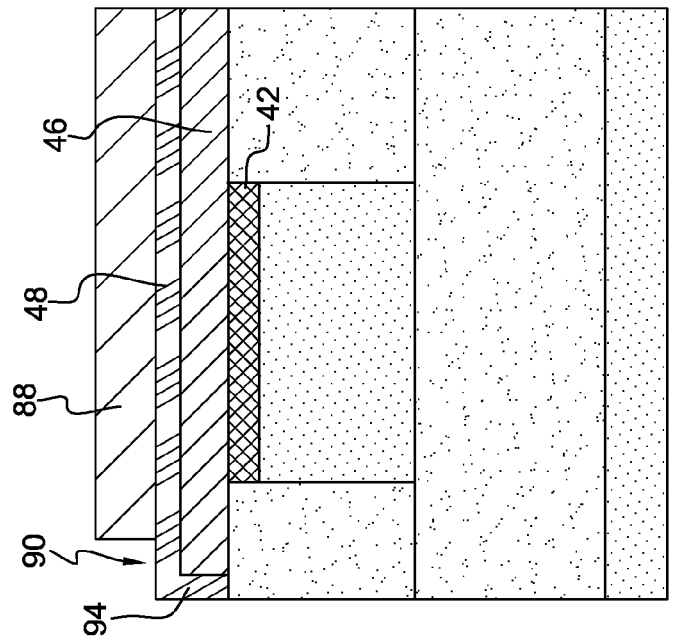
FIGS. 12A and 12B show a patterned photoresist layer on the photonics device portion and the CMOS device portion.
Figure 12A:
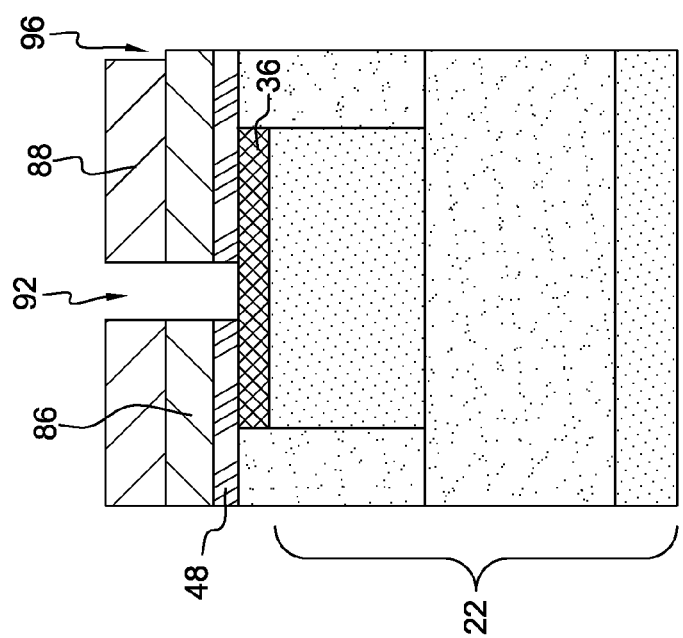

Referring now to FIGS. 12A and 12B, a conventional photoresist 88 may be deposited over the photonics device portion and CMOS device portion and then patterned to form apertures 90, 92, 96. Thereafter, the photonics device portion and CMOS device portion may be exposed to an etchant, for example a conventional reactive ion etching process selective to nitride to remove nitride portion 94 exposed by aperture 90. Oxide 86 through apertures 92, 96 is relatively unaffected by the reactive ion etching process that removes the nitride portion 94. The resultant structure in shown in FIGS. 13A and 13B.

Figure 14B:
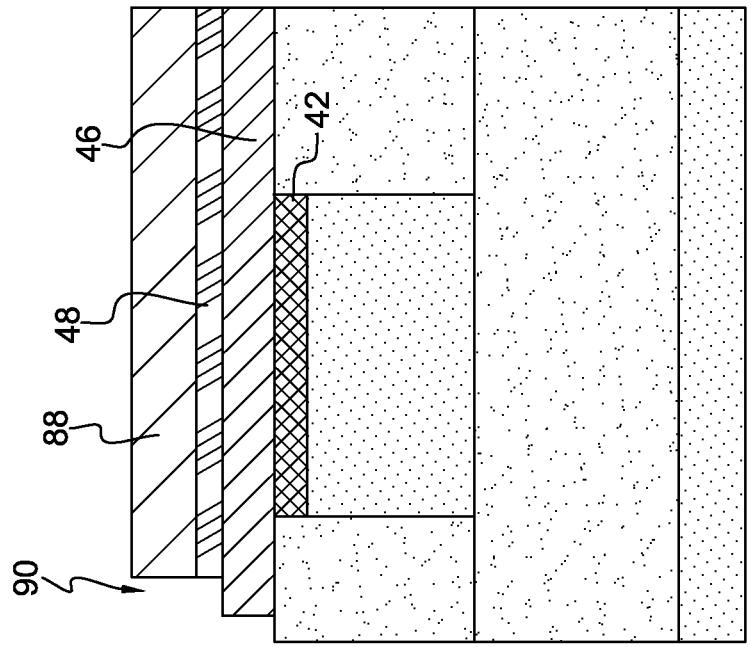
FIGS. 14A and 14B show the etching of the oxide and the nitride layer on the photonics device portion.
Figure 14A:
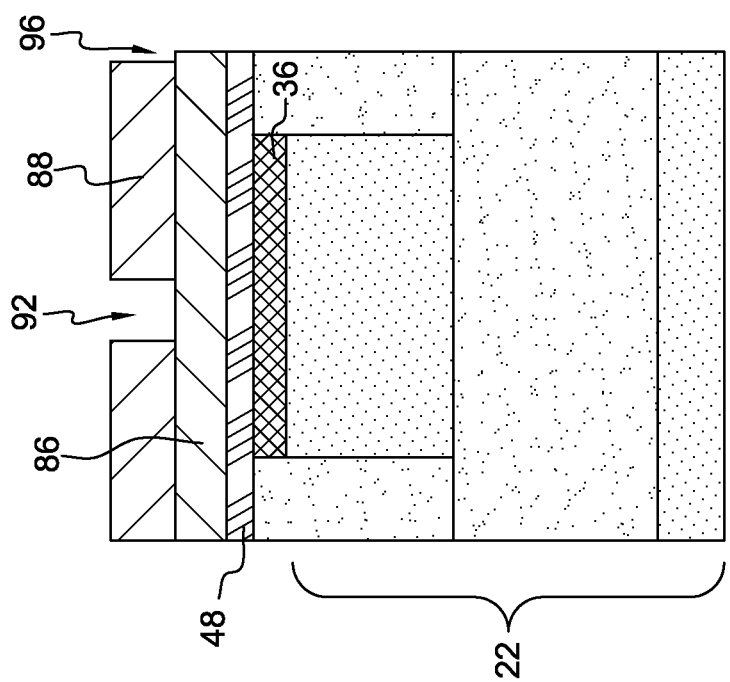

The photonics device portion and CMOS device portion then may be exposed to an etchant, for example a conventional reactive ion etching process selective to oxide to remove the oxide 86 through apertures 92 and 96 followed by another etchant process, for example a conventional reactive ion etching process selective to nitride to remove nitride 48 through apertures 92 and 96, resulting in the structure shown in FIGS. 14A and 14B.

Figure 15B:
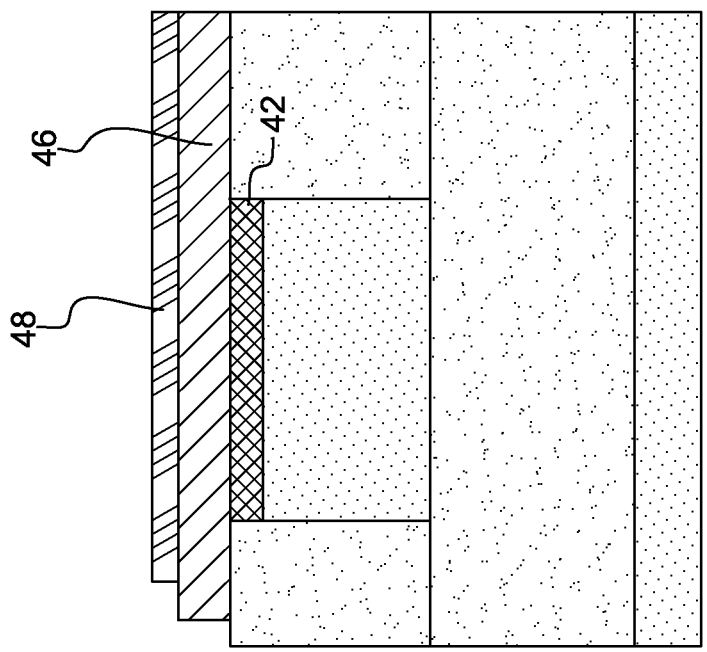
Figure 15A:
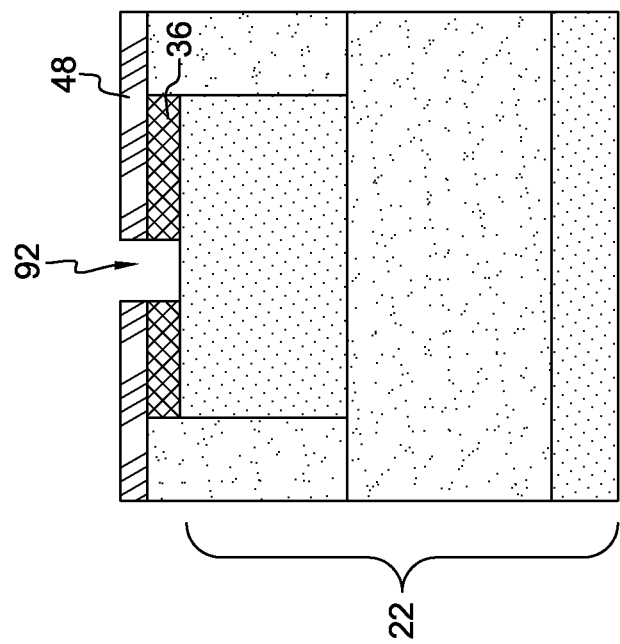

Thereafter, as shown in FIGS. 15A and 15B, the resist 88 and oxide 86 are conventionally stripped. During the oxide strip of oxide 86, the gate oxide 36 may also be removed through aperture 92, unless it's composition is different from oxide 86, such as silicon oxynitride or high K dielectric. As shown in FIG. 15A, the gate oxide 36 through aperture 92 has been removed. The structure shown in FIGS. 15A and 15B is substantially identical to that shown in FIGS. 5A and 5B, including oxynitride layer 60, except that the gate oxide 62 shown in FIG. 5A has already been removed. Processing of the second exemplary embodiment may proceed as described with respect to FIGS. 6A to 10A and 6B to 10B.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:
1. A method for forming a photonics device and a CMOS device with a common gate comprising:
defining a photonics device portion and a CMOS device portion on a semiconductor chip where a photonics device and a CMOS device, respectively, are to be fabricated;
forming a metal or polysilicon gate material on the CMOS device portion;

depositing germanium on the photonics device portion and on the metal or polysilicon gate material on the CMOS device portion;

planarizing the germanium to form a coplanar layer of germanium and metal or polysilicon gate material;

etching the germanium to define a gate on the photonics portion and a gate extension that extends towards the CMOS device portion;

etching the metal or polysilicon gate material to define a gate on the CMOS device portion and a gate extension that extends toward the photonics device portion and joins the gate extension from the germanium gate portion wherein the respective joined gate extensions form a common gate between the photonics device portion and CMOS device portion;

forming spacers on the germanium gate and metal or polysilicon gate;

encapsulating the germanium gate with a nitride; and heating the photonics device portion to cause melting and crystallization of the germanium gate.

2. The method of claim 1 wherein between the steps of forming a metal or polysilicon gate material and depositing germanium, further comprising:

depositing a nitride layer on the photonics device portion and CMOS device portion;

depositing an oxide on the nitride layer on the photonics device portion and CMOS device portion;

planarizing the oxide so that it is only on the photonics device portion and it is coplanar with the nitride layer on the CMOS device portion;

forming apertures in the oxide on the photonics device portion and CMOS device portion;

etching the nitride layer through the apertures; and removing the oxide.

3. The method of claim 1 wherein between the steps of forming a metal or polysilicon gate material and depositing germanium, further comprising the step of forming a bonding layer on a portion of the metal or polysilicon gate material such that the bonding layer promotes the joining of the respective joined gate extensions that form a common gate between the photonics device portion and CMOS device portion.

4. The method of claim 3 wherein the bonding layer is an oxynitride.

5. The method of claim 3 wherein the bonding layer has a thickness of about 10 angstroms.

6. The method of claim 1 where the semiconductor chip comprises a semiconductor on insulator structure.

7. The method of claim 1 wherein the respective joined gate extensions that form a common gate between the photonics device portion and CMOS device portion are coplanar.

8. A method for forming a photonics device and a CMOS device with a common gate comprising:

defining a photonics device portion and a CMOS device portion on a semiconductor chip where a photonics device and a CMOS device, respectively, are to be fabricated;

forming a metal or polysilicon gate material on the CMOS device portion;

depositing germanium on the photonics device portion and on the metal or polysilicon gate material on the CMOS device portion;

planarizing the germanium to form a coplanar layer of germanium and metal or polysilicon gate material;

etching the germanium to define a gate on the photonics portion;

etching the metal or polysilicon gate material to define a gate on the CMOS device portion;

forming spacers on the germanium gate and metal or polysilicon gate;

encapsulating the germanium gate with a nitride; and heating the photonics device portion to cause melting and crystallization of the germanium gate.

9. The method of claim 8 wherein the step of etching the germanium further includes etching the germanium to define a gate extension that extends towards the CMOS device portion and wherein the step of etching the metal or polysilicon gate material further includes etching the metal or polysilicon gate material to define a gate extension that extends toward the photonics device portion and joins the gate extension from the germanium gate portion wherein the respective joined gate extensions form a common gate between the photonics device portion and CMOS device portion.

10. The method of claim 8 wherein between the steps of forming a metal or polysilicon gate material and depositing germanium, further comprising:

depositing a nitride layer on the photonics device portion and CMOS device portion;

depositing an oxide on the nitride layer on the photonics device portion and CMOS device portion;

planarizing the oxide so that it is only on the photonics device portion and it is coplanar with the nitride layer on the CMOS device portion;

forming apertures in the oxide on the photonics device portion and CMOS device portion;

etching the nitride layer through the apertures; and removing the oxide.

11. The method of claim 9 wherein between the steps of forming a metal or polysilicon gate material and depositing germanium, further comprising the step of forming a bonding layer on a portion of the metal or polysilicon gate material such that the bonding layer promotes the joining of the respective joined gate extensions that form a common gate between the photonics device portion and CMOS device portion.

12. The method of claim 11 wherein the bonding layer is an oxynitride.

13. The method of claim 11 wherein the bonding layer has a thickness of about 10 angstroms.

14. The method of claim 8 where the semiconductor chip comprises a semiconductor on insulator structure.

15. The method of claim 9 wherein the respective joined gate extensions that form a common gate between the photonics device portion and CMOS device portion are coplanar.

\* \* \* \* \*